United States Patent
Cheung et al.

(10) Patent No.: US 6,461,980 B1
(45) Date of Patent: Oct. 8, 2002

(54) APPARATUS AND PROCESS FOR CONTROLLING THE TEMPERATURE OF A SUBSTRATE IN A PLASMA REACTOR CHAMBER

(75) Inventors: Jeff S. Cheung, Hayward; Alexandros T. Demos, San Ramon, both of CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 09/493,742

(22) Filed: Jan. 28, 2000

(51) Int. Cl.$^7$ ............................................. H01L 21/31
(52) U.S. Cl. .................................................. 438/765
(58) Field of Search ..................... 427/575; 216/68; 438/905, 584, 680; 361/234; 156/345; 134/1.1

(56) References Cited

U.S. PATENT DOCUMENTS

| | | |
|---|---|---|
| 4,610,748 A | 9/1986 | Engle et al. |
| 4,820,371 A | 4/1989 | Rose |
| 5,292,399 A | 3/1994 | Lee et al. |
| 5,310,453 A | 5/1994 | Fukasawa et al. |
| 5,609,774 A | 3/1997 | Yamazaki et al. |
| 5,685,942 A * | 11/1997 | Ishii ............................ 156/345 |
| 5,761,023 A | 6/1998 | Lue et al. |
| 5,874,361 A | 2/1999 | Collins et al. |
| 5,936,829 A * | 8/1999 | Moslehi ...................... 361/234 |
| 5,968,587 A | 10/1999 | Frankel |
| 5,983,906 A * | 11/1999 | Zhao et al. ................... 134/1.1 |

OTHER PUBLICATIONS

WYKO Surface Profilers Technical Reference Manual, WYKO Corporation, May 1996, 980–085.
Abstract for Worthington, "New CMP architecture addresses key process issues," Solid State Technology, 39:61–62 (1996).
Material Safety Data Sheet, Experimental Polishing Slurry QCTT1030E, Rodel, Inc., Jul. 25, 1995 pp. 1–6.
Section 40, Surface Finish, (Date and Publication Unknown).

* cited by examiner

Primary Examiner—John F. Niebling
Assistant Examiner—Andre' C Stevenson
(74) Attorney, Agent, or Firm—Townsend & Townsend & Crew

(57) ABSTRACT

A process for controlling the temperature of a substrate in a plasma processing reactor chamber comprising flowing a cooling gas to a substrate at a flow pressure; and determining a temperature of the substrate. The difference between the temperature of the substrate and a desired temperature of the substrate is determined; and a pressure by which the flow pressure of the cooling gas is to be adjusted is determined. The flow pressure of the cooling gas to the substrate is adjusted in accordance with the determined pressure.

19 Claims, 10 Drawing Sheets

APPARATUS AND PROCESS FOR CONTROLLING THE TEMPERATURE OF A SUBSTRATE IN A PLASMA REACTOR CHAMBER

BACKGROUND OF THE INVENTION

1. Field of the Invention

The present invention relates to controlling the temperature of a substrate in a plasma reactor chamber. More specifically, the present invention provides for an apparatus and process for monitoring and sensing a change in temperature of a semiconductor substrate, and altering the temperature of the semiconductor substrate in accordance with the change of temperature.

2. Description of the Prior Art

Processing chambers for substrates often include a substrate support, such as a pedestal, for positioning the substrate in the chamber. The substrate could be a semiconductor wafer, a liquid crystal display, a plate of glass, a mirror, etc. The substrate support can be used to heat or cool the substrate. The process used in the chamber can be any desired process such as a chemical vapor deposition (CVD) or a plasma enhanced CVD (PECVD) process, for example. For a PECVD process, an RF field is applied between an electrode in the substrate support and the top of the chamber. A ceramic material may be applied to the top of the support to provide a dielectric to protect the substrate support electrode in a plasma process, or as part of an electrostatic chuck.

An electrostatic chuck is one type of apparatus for holding a wafer in place while it is being processed. Other methods include a vacuum applied to the bottom side of the wafer, or clamps for holding the wafer down. Clamps provide a non-uniform force and cover the edges of the wafer, while a vacuum applied to the bottom of the wafer is not as effective to hold the wafer in place when used in a chamber in which a vacuum is applied to the interior of the chamber, including the upper side of the wafer.

Electrostatic chucks are devices which have gained wide usage in the semiconductor industry for clamping semiconductor wafer during manufacturing processes, such as high density plasma reactions. Electrostatic chucks employ an electrostatic force between oppositely charged surfaces to secure the wafer to the chuck. Fabrication of some electrostatic chucks involves machining a process compatible metal, such as aluminum, into a suitable support pedestal and grit blasting the top surface of the pedestal. A layer of dielectric material, such as ceramic, is then plasma sprayed onto the upper surface of the pedestal and ground to a smooth, planar upper surface for supporting the wafer. Alternately, a polymer film, such as that sold under the trademark Kapton™, available from many well-known suppliers, may be used for the dielectric. During chemical processing of the substrate, the chuck functions by applying a high DC voltage between the chamber walls and the metal pedestal, causing positive charge on one side of the dielectric layer and negative charge on the other side. This charge generates an attractive, substantially uniform, coulomb force there between that secures the wafer to the dielectric layer. Alternately, multiple electrodes may be formed in the pedestal.

One important process parameter in reactor chambers for processing wafers is the temperature of the wafer. During processing, heat is often transferred to or from the substrate or wafer via surface conduction and/or convection between the substrate and the underlying substrate support or through an intervening backside gas. The temperature of the substrate support is typically regulated by circulating heat exchanging fluid such as water or gas, through channels within the substrate support. Alternately, resistive coils can be used to heat the substrate support. The substrate support can thus be used for heating or cooling the substrate. The efficiency of this method, however, is generally limited by the extent to which the backside of the substrate actually contacts the upper surface of the substrate support since, at the microscopic level, only small areas of the two surfaces actually contact each other. To facilitate heat transfer between the substrate and the substrate support, the regions between the contact points are typically filled with gas molecules, such as helium, argon, oxygen, or $CF_4$ to enhance the thermal transfer between the substrate and the substrate support.

A number of prior art patents teach various methods for varying the heat transfer to or from different areas of a wafer. U.S. Pat. No. 4,502,094 teaches enhancing the thermal conductivity by having thermally conductive portions protrude from the susceptor beyond a dielectric layer on the susceptor. In particular, copper pillars are used to provide direct contact with the wafer and draw heat more rapidly. The thermally conductive protrusions are also electrically conductive. Another advantage of this design is that any small particles of debris which may be present on the chuck tend to be attracted onto the dielectric in the gaps between the pillars. Such a chuck is apparently useful in non-plasma reactors. In a plasma reactor, a dielectric is needed to prevent electrical shorts between a plasma electrode and the electrode in the electrostatic chunk, thus requiring the electrostatic chuck electrode to be covered with a dielectric.

U.S. Pat. No. 5,160,152 also discusses an approach using protrusions extending above the electrostatic chuck's surface. This patent distinguishes itself from a structure providing a gas underneath the wafer by providing projections on the top of the electrostatic chuck. U.S. Pat. No. 5,160,152 addresses wafers that get hotter in the middle, due to heat transfer through the sides of the chuck and due to a cooling jacket at the sides of the chuck. The area of the projections is made larger in the central portion of the wafer to provide more heat transfer at the center of the wafer. Smaller area projections are used in the periphery of the wafer. This patent relies on the direct conduction of heat through the projections themselves.

An alternate approach to heat transfer in an electrostatic chuck or other substrate support uses helium gas or another gas applied to the substrate support surface beneath the wafer. Ceramic dielectrics necessary for the electrostatic force on the top of an electrostatic chuck are not particularly efficient for heat transfer, both because of the limited heat transfer characteristics of ceramic material itself, and the inability to polish it sufficiently smoothly, thus leaving interstices at a microscopic level which preclude uniform contact. These interstices, however, can be advantageous. If a helium gas is applied through small holes in the interior of the substrate support, the helium gas can fill the space between the substrate and the wafer, to act as the heat transfer mechanism. One problem with such use of helium gas is preventing it from leaking from the periphery of the substrate support into the chamber itself. Another problem is to control the flow of helium gas to the substrate in such a manner that the wafer remains at a uniform temperature.

U.S. Patent No. 5,761,023 to Lue et al., and assigned to the same assignee as the assignee of the inventions described herein and fully incorporated herein by reference thereto, teaches an improved substrate support and method for operating in which multiple pressure zones are provided on the surface of the substrate support. A seal area is provided between the different zones to allow different gas pressures in the different zones. A higher gas pressure is provided to a zone corresponding to an area of the substrate where greater heat transfer is desired. The gap between the substrate support and the wafer and the gas pressure are each selected to provide the desired amount of heat transfer. A feedback control loop is used to control the pressure in the different zones, and thus, control the temperature of the substrate. At least one temperature sensor is used to provide a temperature signal, with a controller responding to the signal to control the gas pressure to adjust the heating or cooling accordingly. U.S. Pat. No. 5,761,023 further teaches an electrostatic chuck having a dielectric whose thickness varies. In particular, the dielectric is made thicker in the middle of the support so that there is a greater electrostatic force around the periphery of the wafer. This improves the heat transfer at the periphery of the wafer both by virtue of preventing the edges from bowing due to a heat differential at the edges, and by enabling high pressure heat-transferring gas at the periphery of the wafer to be contained without escaping.

It is important that a change in temperature of any part of the wafer be sensed immediately because if different parts of the wafer are at different temperatures, structures on the wafer intended to be identical may be formed at different rates, thus producing inconsistent results. Accordingly, it is desirable to have a uniform temperature across the wafer. Therefore, what is needed and what has been invented is an improved apparatus and an improved process for controlling the temperature of a substrate in a plasma reactor chamber.

SUMMARY OF THE INVENTION

The present invention provides a method for controlling the temperature of a substrate in a plasma reactor chamber comprising monitoring the temperature of a substrate in a plasma processing reactor chamber; and continuously adjusting the temperature of the substrate. The temperature of the substrate is adjusted by adjusting a flow of a cooling gas to the pedestal in accordance with the temperature of the substrate.

The present invention provides an apparatus for controlling the temperature of a substrate in a plasma processing chamber comprising a plasma reactor having a reaction chamber including a chuck; a source of cooling gas communicating with the chuck; and a computer coupled to the reactor chamber and to the cooling gas source for adjusting the temperature of a substrate supported by the chuck in accordance with a calculated pressure based on a determined constant and the difference between the measured temperature of the substrate and the desired temperature of the substrate.

Another embodiment of the present invention further provides a process for controlling the temperature of a substrate in a plasma processing reactor chamber comprising flowing a cooling gas to a substrate at a flow pressure; determining a temperature of the substrate; and determining the difference between the temperature of the substrate and a desired temperature of the substrate. The process also includes determining a pressure by which the flow pressure of the cooling gas is to be adjusted; and adjusting the flow pressure of the cooling gas to the substrate in accordance with the determined pressure.

The present invention also provides a computer program code for causing a processing system to perform the steps of: flowing a cooling gas to a substrate at a flow pressure; determining a temperature of the substrate; determining the difference between the temperature of the substrate and a desired temperature of the substrate; determining a pressure by which the flow pressure of the cooling gas is to be adjusted; and adjusting the flow pressure of the cooling gas to the substrate in accordance with the determined pressure.

These provisions, together with the various ancillary provisions and features which will become apparent to those skilled in the art as the following description proceeds, are attained by these novel apparatuses and processes, a preferred embodiment thereof shown with reference to the accompanying drawings, by way of example only, wherein:

DESCRIPTION OF EMBODIMENTS OF THE INVENTION

Figure 1:
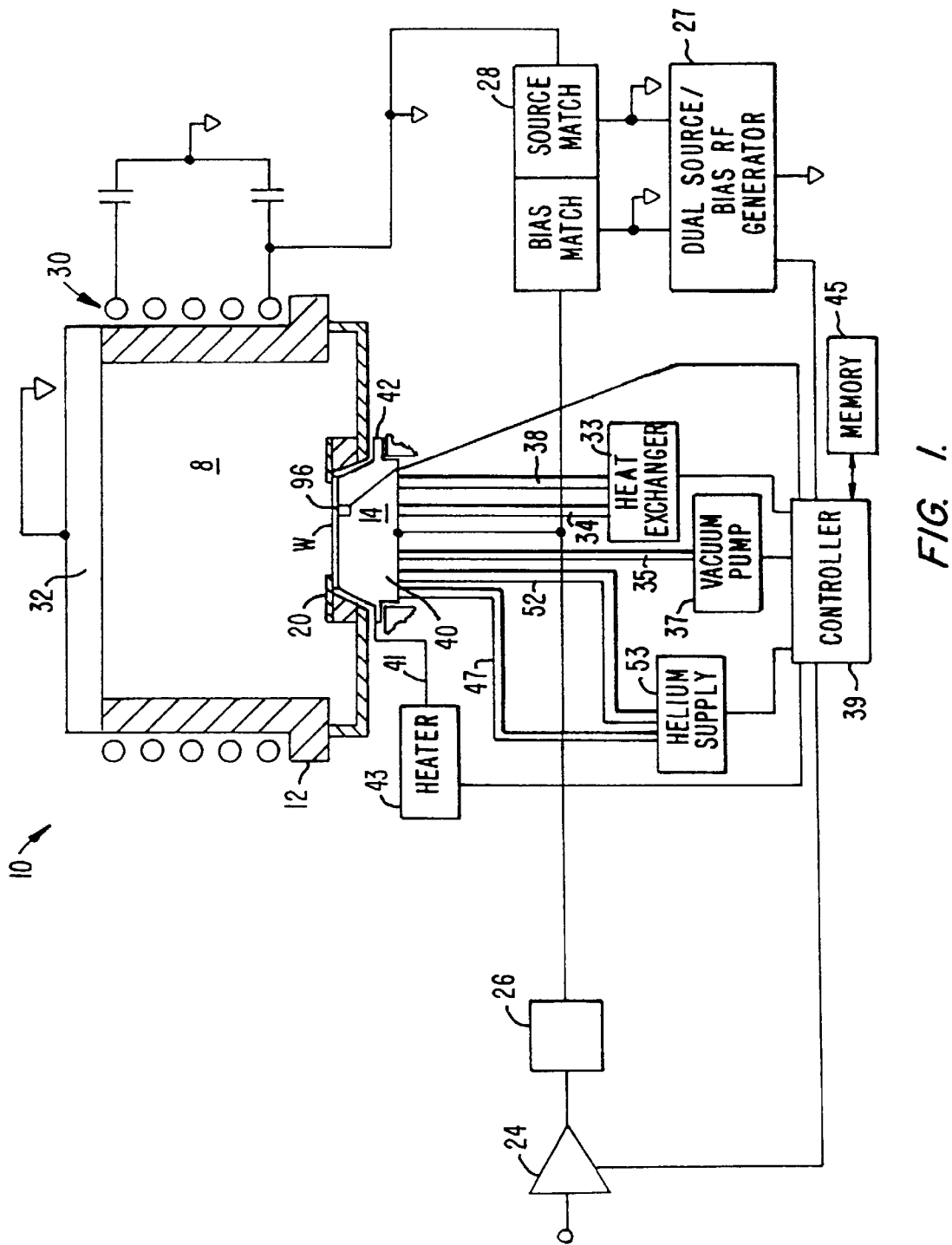
FIG. 1 is a schematic diagram of one embodiment of a semiconductor processing system for the present invention.

Referring in detail now to the drawings wherein similar parts of preferred embodiments of the invention are represented by like reference numerals, there is seen a representative wafer processing apparatus 10 incorporating an electrostatic chuck 14, supports, and electrostatically holds, a semiconductor wafer W within a high density plasma reaction chamber 8 of the apparatus 10. While electrostatic chuck 14 is being used to illustrate embodiments of the present invention, it is to be understood that the spirit and scope of the present would include the employment of any type of pedestal or chuck assembly for supporting a wafer W.

Wafer processing apparatus 10 is attached to a mainframe unit (not shown) which provides electrical, gas, wafer handling and other support functions for the chamber 8. Apparatus 10 usually will be removably attached to the mainframe unit, e.g., with bolts, so that the plasma reaction chamber 8 can be removed for maintenance or repair or can be replaced with another chamber. Mainframe units that are compatible with the illustrative embodiment of wafer processing apparatus 10 are currently commercially available as the Precision 5000™, Centura 5200™ and the Endura 5500™ systems from Applied Materials, Inc. of Santa Clara. It should be understood, however, that although various embodiments of the present invention are shown and described as part of a plasma reaction chamber in a multi-chamber processing system, no embodiment of the present invention is to be limited in this manner. That is, the embodiments of the present invention can be used in a variety of processing chambers.

Wafer processing apparatus 10 includes an enclosure assembly 12 housing the plasma reaction chamber 8 and electrostatic chuck 14. Enclosure assembly 12 includes a cover ring 20 or hot process kit supported over electrostatic chuck 14, preferably by four rods (not shown). Cover ring 20 comprises a dielectric material that serves to prevent or minimize plasma in chamber 8 above the wafer W from contacting, and thereby corroding, part of the electrostatic chuck 14.

The system employing the electrostatic chuck 14 includes conventional electrical circuitry for the plasma reaction chamber 8. The electrical circuitry includes a DC power supply 24 and an RF power supply 27. DC power supply 24 supplies a suitable clamping voltage, e.g., +700 or −1200 volts, between the electrostatic chuck 14 and the chamber walls (which are grounded). Power supply 24 is coupled to electrostatic chuck 14 through a low pass filter 26 which isolates the DC power supply 24 from the RF power supply 27.

The RF power supply provides the plasma reaction power. RF source power and RF bias power are each coupled to the chamber through an impedance matching network 28, with the source power being coupled to an inductive antenna 30 and the bias power being coupled to electrostatic chuck 14. The source RF generator produces the ions in the plasma necessary for the chemical reaction desired. The bias RF drives those ions toward the wafer substrate. A ground reference for both the RF bias power and DC voltage is a grounded top electrode 32. The DC power supply 24 supplies the clamping voltage for developing an electric field to electrostatically hold the wafer W to the pedestal. When it is desired to release (or "de-chuck") the wafer W, source 24 may be switched either to a zero output voltage or to a reverse polarity voltage if it is desired to accelerate the release of the wafer.

The plasma reaction chamber 8 employs inductive-coupled RF power to generate and maintain a high density, low energy plasma. RF bias power is capacitively coupled to the plasma via the wafer W and electrostatic chuck 14, with the grounded counter electrode 32 located in the plasma source region providing a return path for bias current. A more detailed description of the illustrative plasma reaction chamber 8 and its operation in processing wafer W can be found in commonly assigned U.S. Pat. No. 5,350,479, to Collins et al., incorporated herein by reference thereto.

Electrostatic chuck 14 includes inlet water pipe 34 and outlet water pipe 38, both of which are connected to a heat exchanger 33. Helium gas inlets 47 (i.e. outer high pressure Helium inlet) and 52 (i.e. inner low pressure Helium inlet) are connected to a helium supply 53 for providing helium to the surface of the electrostatic chuck beneath the wafer. An optional vacuum line 35 is connected to a vacuum pump 37 for evacuating the helium from the electrostatic chuck surface. In addition to the water pipes, the electrostatic chuck optionally may have a heating line 41 connected to a heater 43 for resistively heating the electrostatic chuck to heat the wafer.

Heat exchanger 33, vacuum pump 37, helium supply 53 and heater 43 are all controlled by a controller 39 operating with a program stored in a memory 45. Controller 39 also controls the DC power supply 24 and the RF power supply 27, as well as other aspects of the wafer processing system not shown in FIG. 1. Also shown is a temperature sensor 96 which is connected so controller 39 for providing feedback on the temperature of the wafer.

Figure 2:
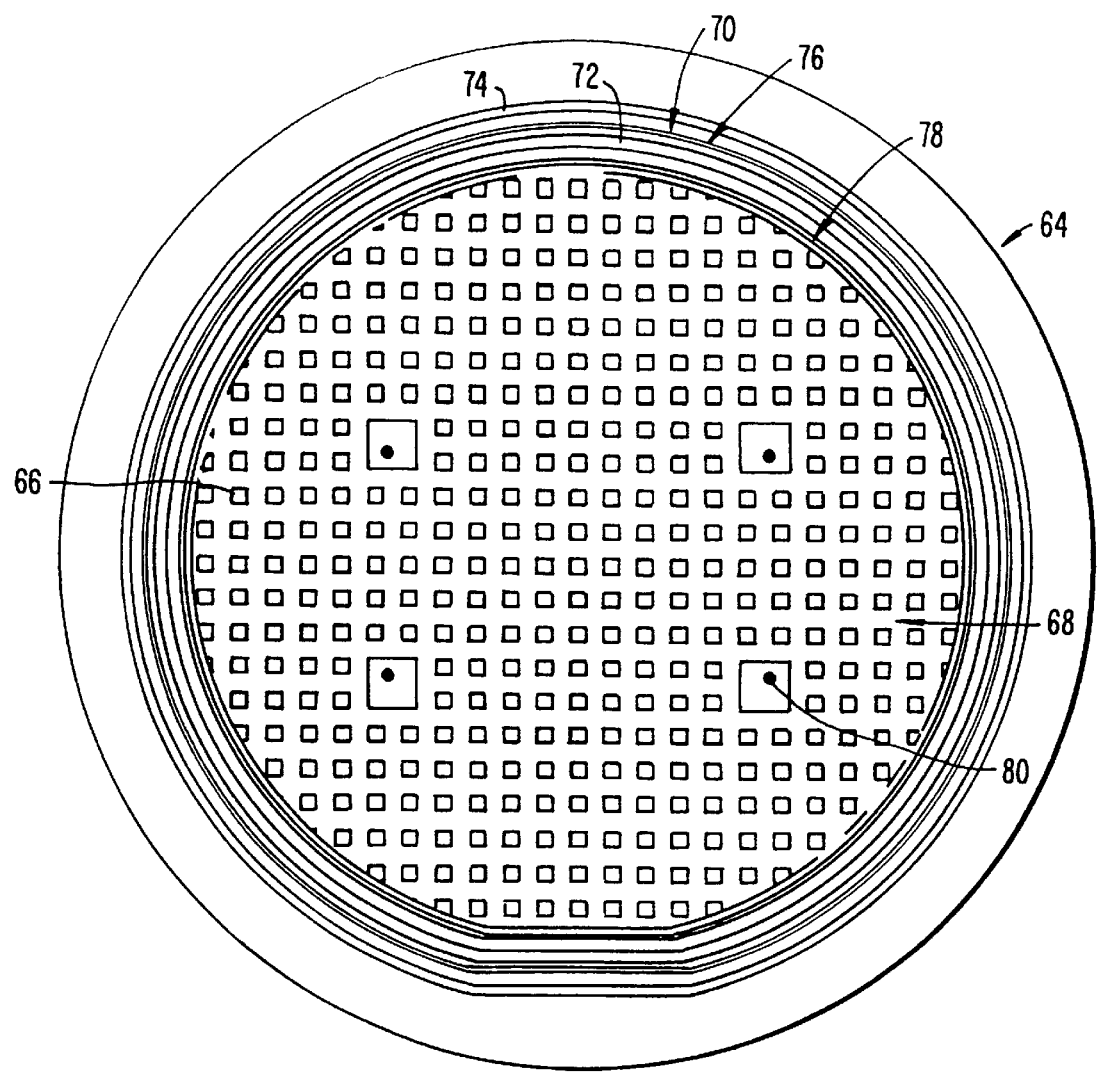
FIG. 2 is a top view of the pressure zones for one embodiment of the present invention.

Referring now to FIG. 2, there is seen a top view of one embodiment of an electrostatic chuck 64 which may be employed in various embodiments of the present invention. Instead of having a smooth top surface, a number of grooves are provided in the surface to form a large number of protrusions 66. A central zone 68 of these protrusions is separated from a peripheral zone 70 by a seal 72. Seal 72 is simply an area which has not had grooves formed in it to provide protrusions, thus forming a solid surface to provide essentially uniform contact with the wafer. An outer seal 74 provides a barrier to minimize leakage of helium gas into the chamber.

Helium gas is inserted into periphery zone 70 through an outer ring 76 which is a groove having a series of holes in it which receive high-pressure helium into this zone from outer high-pressure helium line 47 of FIG. 1. An inner ring 78 allows a lower pressure gas to the central zone 68 from inner low-pressure helium line 52. In operation, after establishing an initial low helium pressure in central zone 68, helium ring 78 typically will be removing helium gas leaking through seal area 72 to maintain the desired low pressure helium. In this fashion, the seal area functions as a baffle so as to bifurcate helium gas inserted into periphery zone 70 so that a portion of the same flows over seal area 72 and into helium ring 78. This creates spaced-apart pressure differentials in the helium gas, i.e., a high-pressure outer ring 76 and a low-pressure in central zone 68. The high-pressure helium gas allows a greater amount of thermal transfer than the low-pressure helium gas; thus, a heat transfer gradient is defined in which a greater amount of heat is transferred from a portion of a wafer disposed adjacent to the periphery zone 70 than is transferred between a portion of a wafer disposed adjacent to the central zone 68. In an optional embodiment, vacuum holes 80, which may be lift pin holes, can be used to pump out the gas in the central zone using vacuum line 35 of FIG. 1 to further lower the pressure in the central zone. Optionally, additional vacuum holes could be added.

Helium outer high-pressure ring 78 is preferably positioned near seal area 72. By positioning it as close as possible, the desired heat transfer step function can be approached. The high pressure gas is thus contained in a narrow region by the periphery. If the high pressure gas extended too far toward the center of the wafer, the cooler center would become even cooler, partially offsetting the reduction in heat differential provided by the high pressure gas. Thus, the heat transfer gradient is a function of a magnitude of a separation of the spaced-apart pressure differential. In operation, for heating the wafer W, low-pressure helium (1–15 torr) is provided into the central zone 68, and high-pressure helium (1–20 torr) is provided to peripheral zone 70. The higher pressure helium in the peripheral zone provides better heat transfer at the periphery of the wafer W.

Seals 72 and 74 are made of the same ceramic coating as the remainder of the top of electrostatic chuck 64. Such a ceramic coating has small interstices, and thus the seal areas do not provide a perfect seal. In addition, the substrate or wafer will have some backside roughness, and may have more roughness than the substrate support. Accordingly, the seal area should have sufficient width to prevent significant leakage of helium from one area to the other. It has been determined by testing that for a ceramic covered electrostatic chuck with the pressure ranges set forth above, that a seal width of 1/10 inch, or 100 mils, is effective. Preferably, the seal width is in the range of 50 to 300 mils. For the outer seal 74, it is desirable to minimize the width because the area of the wafer above this seal will not have the benefit of the heat conduction from the high-pressure helium. At the same time, the seal must be wide enough to prevent significant leakage of helium into the chamber which could affect the reaction in the chamber. The same 100 mil width has been found effective, with an optimum seal width being in the range of 50 to 300 mils. Alternate widths may be appropriate for different materials and smoothness of the substrate support and substrate. For example, if a polymer film, such as Kapton™, available from many well-known suppliers, is used, a small width can be achieved because of its compliancy.

A preferred heat transfer gas is helium because it is inert and relatively inexpensive. Any noble gas (e.g., nitrogen, ergon, helium, krypton, radon and xenon) may be used. Preferably and alternately, argon, oxygen, $CF_4$, or other gases could be used, or a mixture of gases may be used. A mixture could be used, for instance, to give additional pressure control capabilities. The particular gas could be chosen to be compatible with the chemical process in the chamber so that any leaking gas will have minimal effect on the chemical reactions. For example, in an etching reaction using fluorine as an etching species, it may be desirable to use $CF_4$ as the backside heat transfer gas. For purposes of illustrating the present invention, helium will be used as the cooling gas.

Because heat conduction occurs primarily through the helium gas, it is desirable to minimize the size and number of the protrusions and seal areas for this purpose. Thus, there should be less contact area than non-contact area over the area of the substrate. On the other hand, the seals 72 and 74 are required to prevent gas leakage and the protrusions must be of sufficient size and spacing to mechanically support the wafer. In addition there are other factors to be optimized. The height of the protrusions, which determine the gap between the substrate and the substrate support between the protrusions, must be sufficient to allow the gas to quickly become distributed throughout the zones without affecting a process start up time. Typically, this must be on the order of a few seconds, and preferably the gas is distributed in 10 seconds or less.

For optimum heat transfer, the gap should be small enough so that heat transfer primarily occurs by molecules travelling directly from the substrate to the substrate support without colliding with another gas molecule, giving free molecular heat transfer. Thus, the gap should be less than the mean free path of the gas (or the average free path if a mixture of gases is used). The mean free path is a function of the pressure of the gas and the molecular collisional cross-section. Where a variety of pressures will be used, the mean free path will vary. In a preferred embodiment, the mean free path of the maximum pressure to be applied is used to determine the gap dimension.

In addition, the ratio of the gap to the overall dielectric thickness must be kept small to avoid local anomalies on the substrate. If this ratio is significant, the equivalent capacitance will vary significantly between the spaces and the protrusions, applying a significantly different electric field to the substrate. This different field can affect the chemical process, causing non-uniformities in the film that is being deposited, etched, doped, or undergoing other property transformations. Some difference will necessarily be present, but it is desirable to minimize this. The significance of the ratio also varies depending on the dielectric material in particular the difference between the dielectric constant of the material and the heat transfer gas (essentially one). The closer the two dielectric constants, the less the concern with a larger gap. Another concern in setting the gap size is to avoid having a plasma generated with the heat transfer gas between the substrate support and the backside of the wafer. It is believed that this would begin to be a concern if the gap size were several times the mean free path of the heat transfer gas.

For one embodiment of the electrostatic chuck 14, the thickness of the ceramic coating is on the order of 7–10 mils. If Kapton™ is used, a thickness of 1–2 mils may be used. Ideally, for chucking purposes, the dielectric is as thin as possible within the limits of maintaining manufacturing consistency and avoiding dielectric breakdown. The mean free path of helium at the pressures for the two zones described above is about 1–5 mils (at very high pressures, the mean free path may be less than one). Accordingly, protrusion heights of 0.7–1.2 mils have been chosen, tested, and found effective. This gives a gap less than the mean free path of helium at the desired pressures. Preferably, the gap is less than twice the mean free path of the heat transfer gas at the pertinent pressures, and more preferably less than the mean free path.

The spacing between the protrusions is as large as possible while still supporting the substrate without bowing. In one embodiment, the substrate is kept planar, while in other embodiments it may be desirable to vary the protrusion height, or alternately the top surface of the substrate support (with the protrusions of equal height), to properly support a curved substrate. Another factor is avoiding sharp points that could cause local anomalies in the electric field. Too large a spacing can also affect the movement of charge during dechucking, causing damage. It has been determined that an optimum center-to-center spacing of the protrusions is in the range of 100–300 mils, more preferably approximately 300 mils. The size of the protrusions themselves is preferably between 10 and 150 mils, more preferably approximately 130 mils in diameter. Square protrusions are shown simply because of their ease in manufacture, and other shapes could be used as well. Annular shapes could be used, for example.

In the embodiment shown, no openings for removing gas are shown in the outer peripheral region, although this can be provided in an alternative embodiment. The control of helium pressure can be done either by providing high or low pressure helium, or by more pumping through a vacuum pump. Similarly, for the central region, the pressure can be controlled in either of these ways or through a combination of both. The placement of the helium source as a ring near the edges in combination with a vacuum near the middle of the support provides an additional pressure gradient within the central region, decreasing towards the center. An alternate embodiment of the present invention thus provides a coarse adjustment of the heat transfer through the two pressure zones, with a fine tuning occurring through the placement of the helium inlet and vacuum outlets in the central portion. In alternate embodiments, more than one zone could be used for finer adjustments, with the trade off of requiring more hardware.

Figure 3:
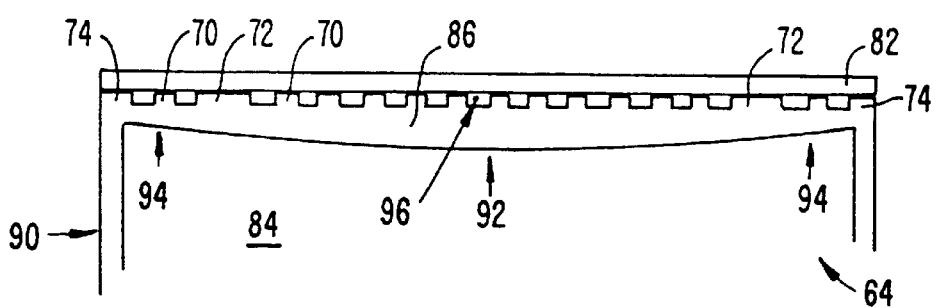
FIG. 3 is a partial side view of an electrostatic chuck for one embodiment of the invention.

Referring now to FIG. 3, there is seen a side view of one embodiment of an electrostatic chuck 64 showing a varying dielectric thickness of a dielectric 86. A wafer 82 is shown mounted on the chuck. The chuck includes an electrode portion 84 covered by dielectric 86. The dielectric extends across the top and along the sides 90 of the electrostatic chuck. As can be seen, the dielectric is thicker at a central portion 92, and thinner at peripheral portions 94. The side view shows the multiple protrusions 70 and also shows the inner seal 72 and the outer seal 74. The thinner dielectric at peripheral portions 94 provides a stronger electrostatic force at these portions. This is beneficial for a number of reasons. First, it holds the wafer W more tightly, ensuring better heat transfer by providing better contact with the top of the electrostatic chuck. Second, a tighter force helps hold in the higher pressure helium between seals 72 and 74 near the periphery. In addition, if the peripheral portion of the wafer has a temperature different from the central portion, this may cause it to bend relative to the central portion, and it may bow up or down, further exacerbating the heat differential problem. This can be overcome by an appropriately higher electrostatic force at the peripheral portion.

In an alternate embodiment, the varying dielectric thickness can be used without the two pressure zones, or without the protrusions. The varying in the dielectric coaxing can be continuous, or stepwise. A stepwise difference makes the manufacturing simpler and less expensive. Another advantage of the seal area 74 and the stronger electrostatic force at the edge of the wafer is to prevent arcing of the plasma to exposed metal near the top surface of the electrostatic chuck. Such exposed metal would typically be at the helium inlet ports, which would come up through the aluminum electrode, thus exposing through those holes a path to the electrode. Arcing is prevented by providing a tighter seal, locating the helium inlet holes sufficiently away from the edges of the electrostatic chuck, or putting a groove there to prevent such arcing. As shown in FIG. 3, a temperature sensor 96 can be placed in the space between the top surface of the electrostatic chuck and the wafer. The temperature of the wafer W can thus be inferred or detected from the sensor 96.

Figure 5:
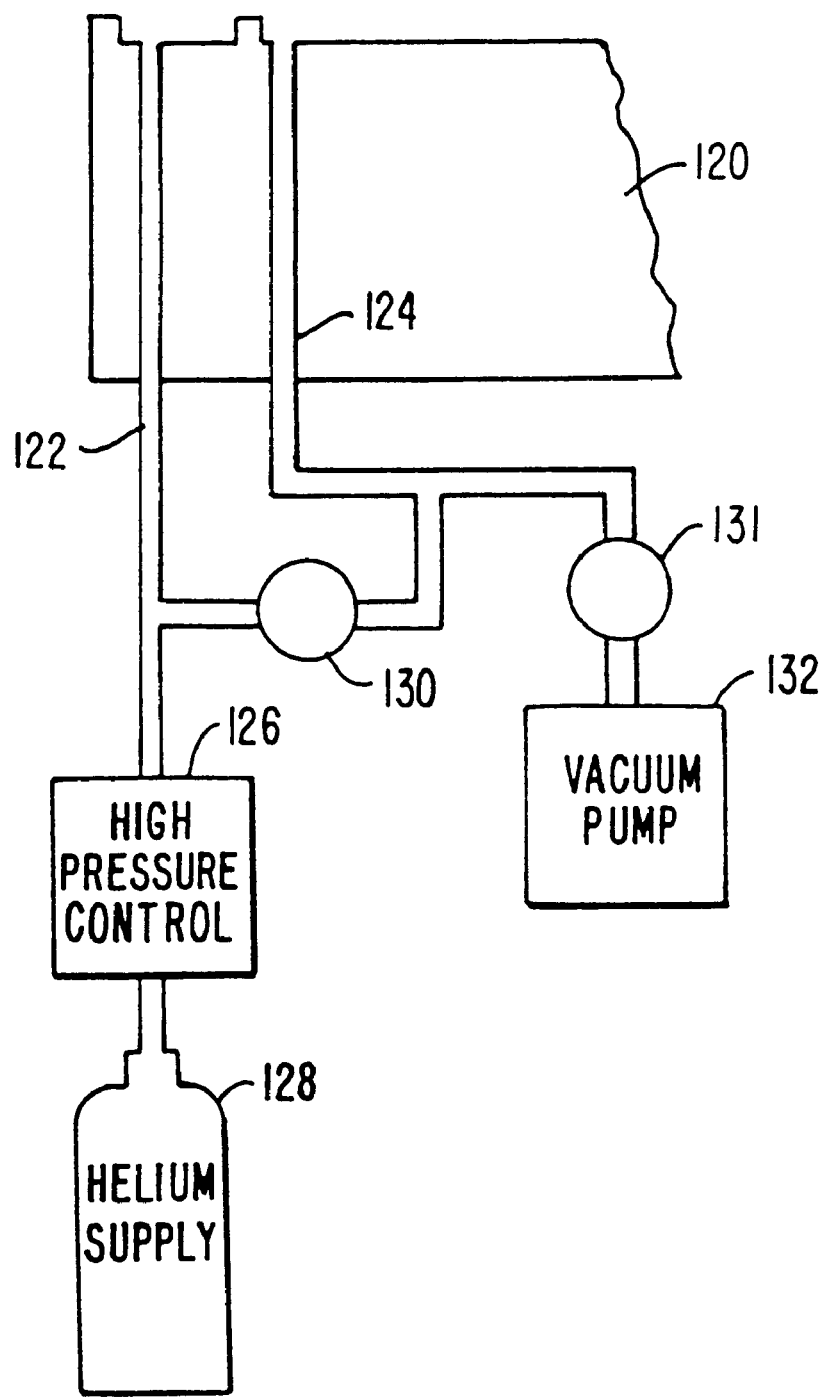
FIG. 5 is a diagram of one embodiment of a gas pressure control system according for one embodiment of the present invention.

One embodiment of a pressure control system for two pressure zones is shown in FIG. 5. A substrate support 120 has a high pressure gas line 122 and a low pressure gas line 124 connected to separate zones. A high pressure helium controller 126 feeds high pressure line 122 from a pressurized helium tank 128. Controller 126 monitors the pressure at its output, and controls the flow of helium to maintain the desired pressure. A valve 130 provides a pressure drop between high pressure line 122 and low pressure line 124. In this way, a single pressure controller can be used to control both pressures. A vacuum pump 132 is also connected to low pressure line 124 to provide another level of control through a valve 131. Alternatively, two separate controllers could be used, or the vacuum pump could be connected to a separate line. Alternatively, flow restrictors could be used instead of valves. In another embodiment, separate pressure controllers and flow restrictors could be used for the separate pressure zones.

Figure 4:
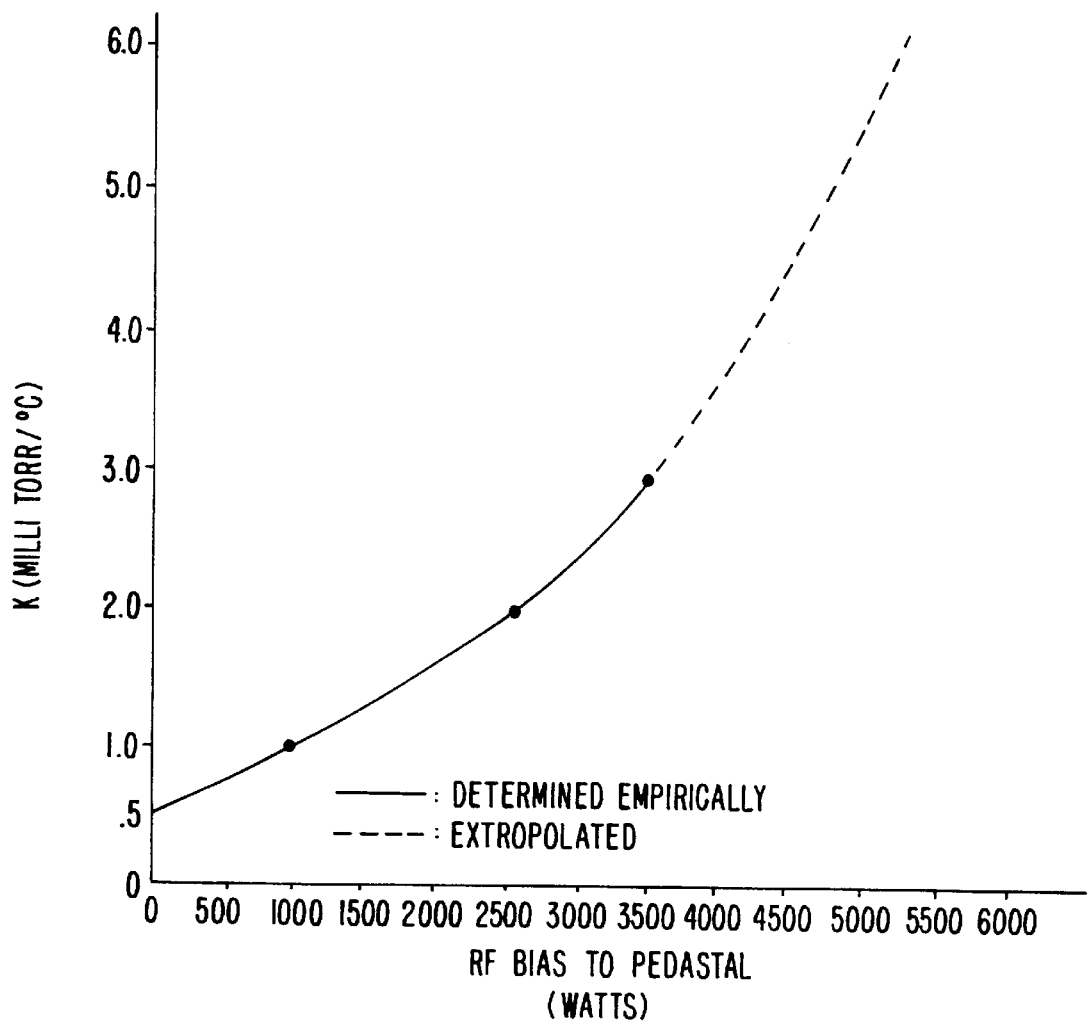
FIG. 4 is a graph of K vs. RF bias to the pedestal.

In the wafer temperature control system and process for embodiments of the present invention, the following formula is employed for adjusting the rate of helium gas flow to the electrostatic chuck 14:

$$P = K(T_w - T_{Sp})$$

where K (milliTorr/°C.) is determined from the graph of FIG. 4 which was developed empirically, $T_w$ is temperature (°C.) of the wafer W as detected by the temperature sensor 96, $T_{sp}$ is set point temperature (°C.) of the wafer W which depends on the process and reactor conditions, and P (milliTorr) is the increase or decrease in helium pressure that will have to be implemented in order to keep the temperature of the wafer W at a generally constant temperature. Thus, if P calculates to be a positive pressure, the controller 39 (see FIG. 1) would send a signal to helium supply 53 to increase helium pressure, thus increasing the flow rate of helium gas for increasing wafer cooling, via outer high pressure helium gas inlet 47 and inner low pressure helium gas inlet 52. The ratio of the value of the pressure of outer high pressure He to the value of the pressure of inner high pressure He (i.e., outer helium pressure/inner helium pressure) is a constant set by the operator, depending on the pressure and reactor conditions. This constant is an input value into the memory 45 of the controller 39. If P calculates to be a negative pressure, the controller 39 will send a signal to helium supply 53 to decrease helium pressure, thus decreasing the flow rate of helium gas for decreasing wafer cooling, via outer high pressure helium gas inlet 47 and inner low pressure helium gas inlet 52. The ratio of outer helium pressure to inner helium pressure may vary from about 0.5 to about 5.0, preferably from about 1.0 to about 4.0, more preferably from about 1.0 to about 2.5, and most preferably from about 1.0 to about 2.0. As previously indicated, the ratio is determined by the operator and is based on the type of plasma processing taking place in the wafer processing apparatus 10. Thus, if the outer and inner helium pressures are respectively 8,000 milliTorr and 4,000 milliTorr such that the ratio is 2.0, which is to remain 2.0 throughout the plasma processing operation, and if P calculates to be plus (+) 30 milliTorr; the outer helium pressure would be increased by 2(30) milliTorr, where "2" is the previously set ratio, whereas the inner helium pressure would be increased only 30 milliTorr in order to maintain the ratio of the outer helium pressure to the inner helium pressure at 2.0 (i.e., 8,000+2(30)/4,000+30=2.0). As previously indicated, K is determined from FIG. 4 which is a graph of K vs. RF bias to pedestal (watts). Typically, K ranges from about 0.50 to about 6.0, preferably from about 0.50 to about 5.0, more preferably from about 1.0 to about 4.0, and most preferably from about 1.5 to about 3.0. As previously indicated, the FIG. 4 graph of K vs. RF (watts) was developed empirically by determining how the wafer temperature responds to different RF power levels. When high power levels are introduced, a larger increase in wafer temperature is obtained. In order to control wafer temperature, a higher K value is required. Wafer temperature is also controlled by varying the pressure of the helium gas from the helium supply 53. The calculated value of P determines the increase or decrease in pressure of helium gas from the helium supply 53.

The wafer temperature control system and process of the present invention also employs the following parameters: (1) $Time_{CD}$ temperature control delay which is the delay in time for allowing the wafer W to heat up before helium is permitted to flow to the chuck 14 for commence cooling of the wafer W; (2) $P_{IHMAX}$, maximum inner helium pressure permitted without controller 39 shutting down the apparatus 10; (3) $P_{IHMIN}$, minimum inner helium pressure permitted without controller 39 shutting down the apparatus 10; (4) $P_{OHMAX}$, maximum outer helium pressure permitted without controller 39 shutting down the apparatus 10; (5) $P_{OHMIN}$, minimum outer helium pressure permitted without controller 39 shutting down the apparatus 10; (6) $T_T$, the trigger temperature which is the temperature that triggers the controller 39 to send a signal to the helium supply 53 to commence supplying helium to the chuck 14 for cooling purposes; (7) $Time_S$, the sampling time or interval for reading the wafer temperature $T_W$ and making a cooling or heating adjustment in accordance with P=K $(T_W-T_{SP})$; and (8) $T_{FAULT}$, temperature which when respectively substracted from and added to $T_{SP}$ gives a temperature range that ranges from about $(T_{SP}-T_{FAULT})$C.° to about $(T_{SP}+T_{FAULT})$C.°, which below and above, respectively, causes the controller 39 to send a signal to cause the apparatus 10 to shut down. Time$_{CD}$ is an option to $T_T$ since both would not be needed as both function to start the flow of helium. Time$_{CD}$ controls and starts the flow of helium after a delay in time from time of start-up. $T_T$ controls and starts the flow of helium after the temperature of the wafer W reaches the value assigned for $T_T$. Thus, $T_T$ is independent of time and Time$_{CD}$ is independent of the temperature of the wafer W. All of the foregoing parameters are constants and are input into the memory 45 of the controller 39.

The value of any particular parameter depends on the process and reactor conditions. In one embodiment of the present invention, Time$_{CD}$ ranges from about 5 secs. to about 30 secs; preferably from about 10 secs. to about 20 secs; more preferably from about 15 secs. to about 20 secs; In another embodiment of the present invention $P_{IHMAX}$ ranges from about 5000 milliTorr to about 8000 and $P_{IHMIN}$ ranges from about 500 milliTorr to about 2000 milliTorr.

In another embodiment of the present invention $P_{OHMAX}$ ranges from about 8000 milliTorr to about 9950 milliTorr and $P_{OHMIN}$ ranges from about 1000 milliTorr to about 5000 milliTorr. Time$_S$ ranges from about 100 millisecs. to about 500 millisecs; preferably from about 200 millisecs. to about 300 millisecs. $T_{FAULT}$ ranges from about 10° C. to about 30° C.; preferably from about 15° C. to about 25°. $T_T$ ranges from about 400° C. to about 410° C.

In operation of one embodiment of the invention, the following parameters are assigned to (or inputed into) the memory 45 of the controller 39 (or computer): K; $T_{SP}$; ratio of outer/inner helium pressure; $T_T$ (or Time$_{CD}$); initial flow rate for helium when $T_T$ triggers the commencement of helium flow to the chuck 14 which is preferably before the time when chemical vapor deposition (CVD) commences; $P_{IHMAX}$; $P_{IHMIN}$; $P_{OHMAX}$; $P_{OHMIN}$; Time$_S$; and $T_{FAULT}$. The wafer W is disposed in the plasma reaction chamber 8 and the apparatus 10 is turned on for subsequent CVD on the wafer W. The preferred order of operation is to initially heat with top RF source power, then commence the flow of helium, followed by additional heating with RF bias power to the check 14, and subsequently commencing CVD. Assuming $T_T$ is employed instead of Time$_{CD}$, when the temperature of the wafer W reaches the value of $T_T$ (which is less than $T_{SP}$ by from about 5° C. to about 40° C., preferably by from about 10° C. to about 20° C., a signal is sent by controller 39 to the helium supply 53 to begin the flow of helium to the wafer W via inlets 47 and 52. Subsequently, the controller 39 sends a signal to commence RF bias power to chuck 14 and additional heating of wafer W commences. Preferably the controller 39 commences RF bias power to the chuck 14 after from about 1 sec. to about 10 secs., more preferably after from about 3 secs. to about 5 secs., helium begins to flow to the underside of the wafer W. Preferably, helium begins to respectively flow through outer high pressure helium gas inlet 47 from a pressure ranging from about 5000 mTorr. to about 8000 mTorr. and through inner low pressure helium gas inlet 52 at a pressure ranging from about 2000 mTorr. to about 4000 mTorr. Subsequently, the controller 39 signals to commence CVD. Preferably, CVD begins at approximately the time the temperature of the wafer W reaches $T_{SP}$. After the wafer W reaches $T_{SP}$, Time$_S$ kicks in for monitoring the temperature $T_W$. Thus, and assuming 250 ms is the value of Time$_S$, 250 ms after $T_{SP}$ is reached, $T_W$ is read and determined for making any required adjustment in the flow of helium through inlets 47 and 52. As previously mentioned, the flow rates of helium are adjusted via $P=K(T_W-T_{SP})$, all in order to maintain $T_W$ at a value essentially equal to $T_{SP}$.

Figure 9:
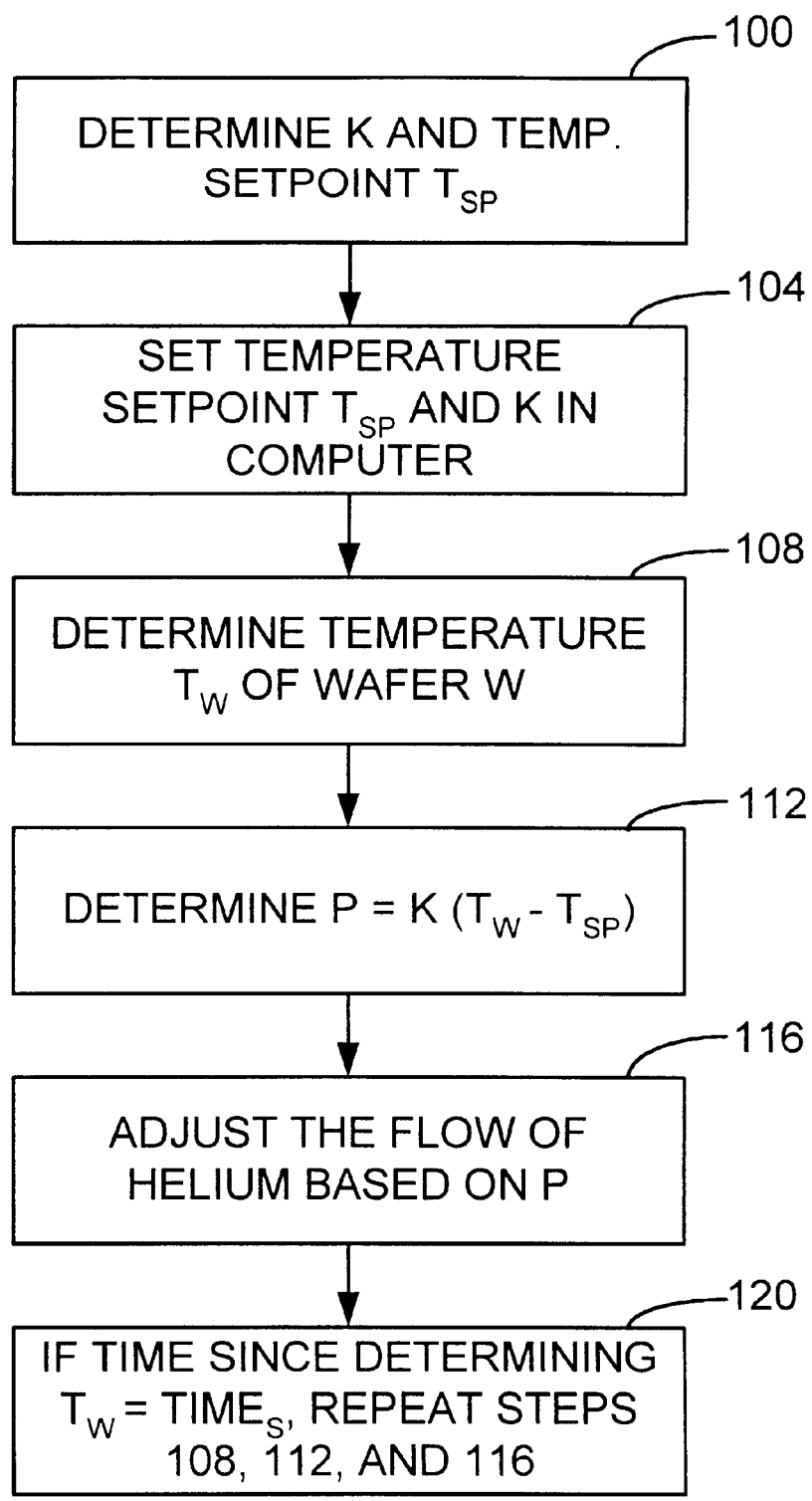
FIG. 9 is a block process flow diagram for another embodiment of the invention.

Referring now to FIG. 9, there is seen a block flow diagram which broadly illustrates the process steps for controlling the temperature of the wafer W. As seen in FIG. 9, K and $T_{SP}$ are determined in step 100, and the values of K and $T_{SP}$ are assigned in memory in the computer by step 104. After the apparatus 10 is on-line in accordance with the procedure previously mentioned, $T_W$ is determined in step 108 from a temperature sensor 96 which is coupled to the controller as shown in FIG. 1. After $T_W$ is determined, P is determined in step 112, and the flow of helium to chuck 14 via inlets 47 and 52 is adjusted in step 116 in accordance with $P=K(T_W-T_{SP})$. If the time since determining $T_W$ in step 108 is equal to Time$_S$, (sampling time), steps 108, 112 and 116 are repeated to obtain another P for adjusting the flow of helium. The procedure is continued throughout the entire plasma processing process.

Figure 10:
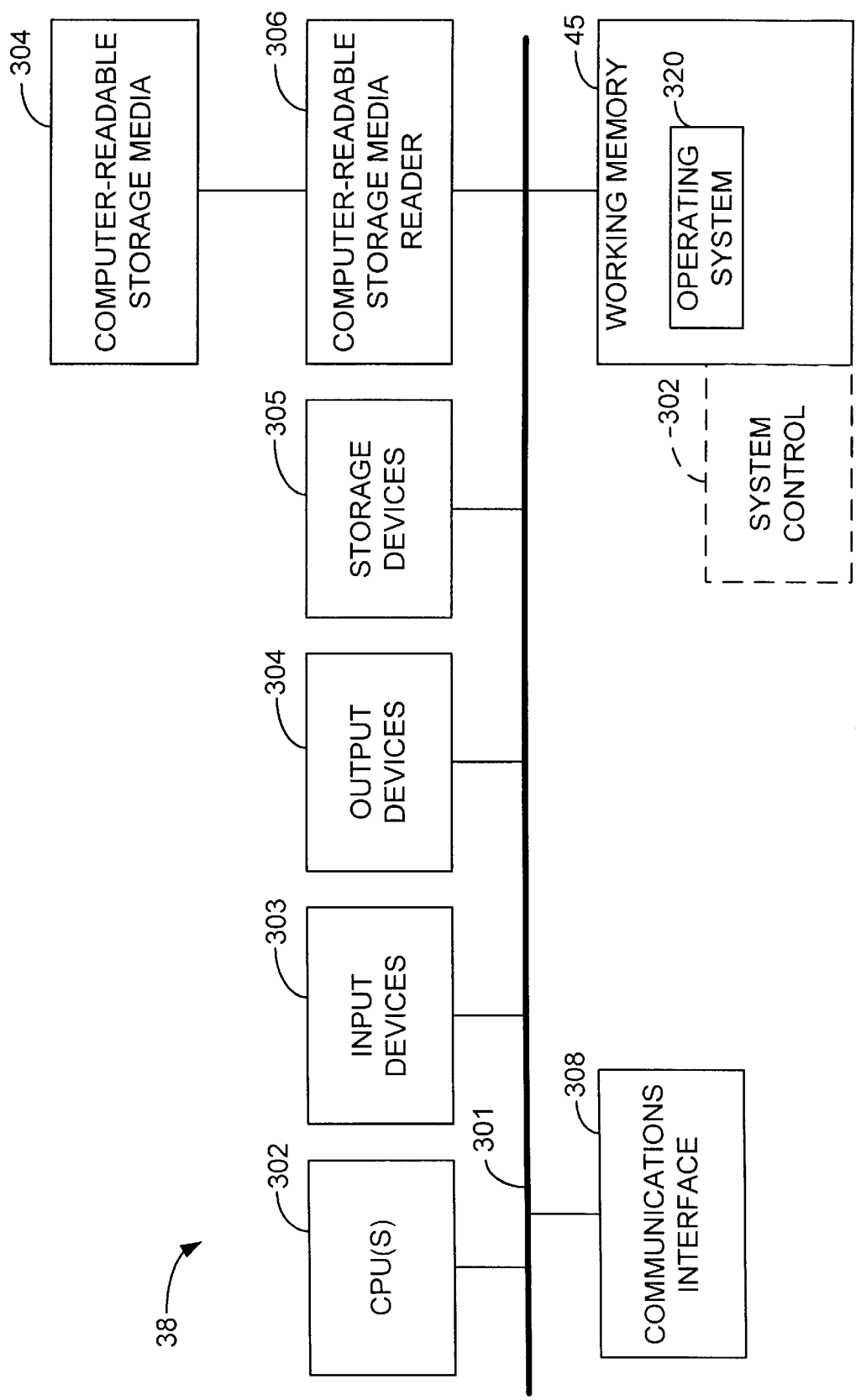
FIG. 10 is a flow diagram broadly illustrating a processing system for the controller and memory according to another embodiment of the invention.

Referring now to FIG. 10, there is seen the controller 38 processing system hardware elements electrically connected via bus 301 including processor 302, input devices 303, output devices 304, storage devices 305, computer-readable storage media reader 306, memory 45 and communications interface 308. Computer readable storage media reader 306 (e.g. memory and/or storage device interface) is further connected to computer-readable storage media 304. Controller 38 also comprises software elements including operating system ("OS") 320 and system control 302. The software elements, the storage media 304, the storage media reader 30 in combination with other features of the controller 38, are capable of causing embodiments of the processes of the present invention to be conducted.

Thus, the functions performed by the controller are done under the control of a program in memory 45. That program will include instructions for performing the various steps, such as instructions for reading the temperature indication from the temperature sensor, an instruction for comparing that temperature to the desired input set temperature, and an instruction for controlling the pressure valve (or flow restrictor) to vary the pressure of the gas in a particular pressure zone. Other instructions are provided to shut off the gas in the event of a fault, etc., all as previously indicated above.

The helium pressure can be controlled by increasing or decreasing the pressure where a simple one pressure electrostatic chuck is used. Alternately, where two pressure zones are used as in the preferred embodiment of the invention, the outer and inner helium pressures can be controlled separately. The temperature of each region can be inferred from a single temperature sensor which may be placed, for instance, near the intersection of the two zones. Alternately, two different temperature sensors could be used. In other alternate embodiments, the temperature sensor could be attached to the top surface of the electrostatic chuck, or alternately be put in direct contact with the wafer itself. The temperature sensor may be used to infer the pressure, such as where there is leakage between zones causing a pressure variance. A pressure regulator may detect only the pressure at its output, which would typically be some distance from the wafer, which could thus have a different pressure under it. A temperature sensor could be used to infer the actual pressure under the wafer. Depending on the wafer surface roughness, the leakage could vary, and the pressure provided may need to be varied.

The control system typically will have certain constraints on it. For instance, the helium pressure is limited so that the wafer is not lifted off the electrostatic chuck or so much of a pressure differential is provided to cause a thermal gradient that damages the wafer due to thermal stress. In the event that such constraints are exceeded, or some other defined fault occurs, the gas flow is stopped.

The invention will be illustrated by the following set forth example which is being given to set forth the presently known best mode and by way of illustration only and not by way of any limitation. All parameters such as concentrations, mixing proportions, temperatures, pressure, rates, compounds, etc., submitted in this example are not to be construed to unduly limit the scope of the invention.

EXAMPLE

A test semiconductor silicon wafer was disposed in the reaction chamber of a plasma processing apparatus sold under the trademark Ultima HDP-CVD, owned by Applied Materials Inc., 3050 Bowers Avenue, Santa Clara, Calif. 95054-3299.

The following parameters and their associated listed values were fed into memory of a controller that was used to control the plasma processing apparatus:

| Parameter | Value |
| --- | --- |
| K | 1.5 milliTorr/° C. |
| $T_{SP}$ | 420° C. |
| Outer/Inner He Pres. | 1.5 |
| $T_T$ | 405° C. |
| $P_{IHMAX}$ | 9950 mTorr |
| $P_{IHMIN}$ | 50 mTorr |
| $P_{OHMAX}$ | 9950 mTorr |
| $P_{OHMIN}$ | 50 mTorr |
| $T_{FAULT}$ | 10 secs. |
| $Time_s$ | 250 ms |

| Reactor Conditions | |
| --- | --- |
| Pressure | 5 mTorr |
| RF Power to Coil Inductor | 1200 watts |
| RF Power to Wafer Pedestal | 2500 watts |
| Temperature of Test Wafer | 420° C. |
| $SiO_2$ Deposition | 2000 Å/min |

| Process Conditions Based on the Flow Rate of Ar, $O_2$ and $SiF_4$ | |
| --- | --- |
| Ar | 60 sccm |
| Ar (Top) | 5.0 sccm |
| $O_2$ | 118 sccm |
| $S_iH_4$ | 38 sccm |
| $S_iH_4$ (Top) | 4.0 sccm |
| Pressure | 5 mTorr |
| RF Power to Coil Inductor | 1200 watts |
| RF Power to Wafer Pedestal | 2500 watts |
| Temperature of Test Wafer | 420° C. |
| $SiO_2$ Deposition Rate | 2000 Å/min |

Figure 6:
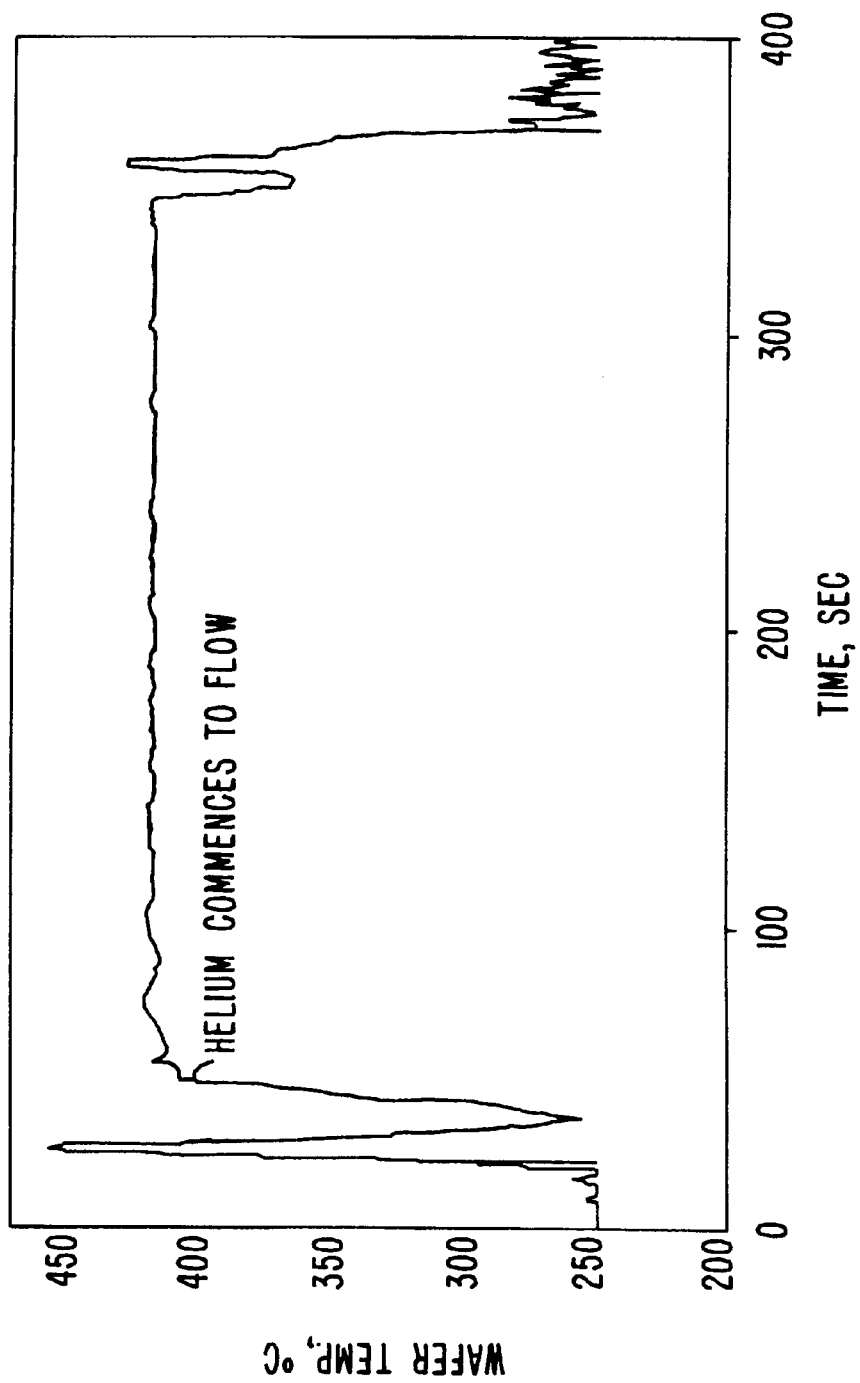
FIG. 6 is a graph of wafer temperature vs. time for the example.
Figure 7:
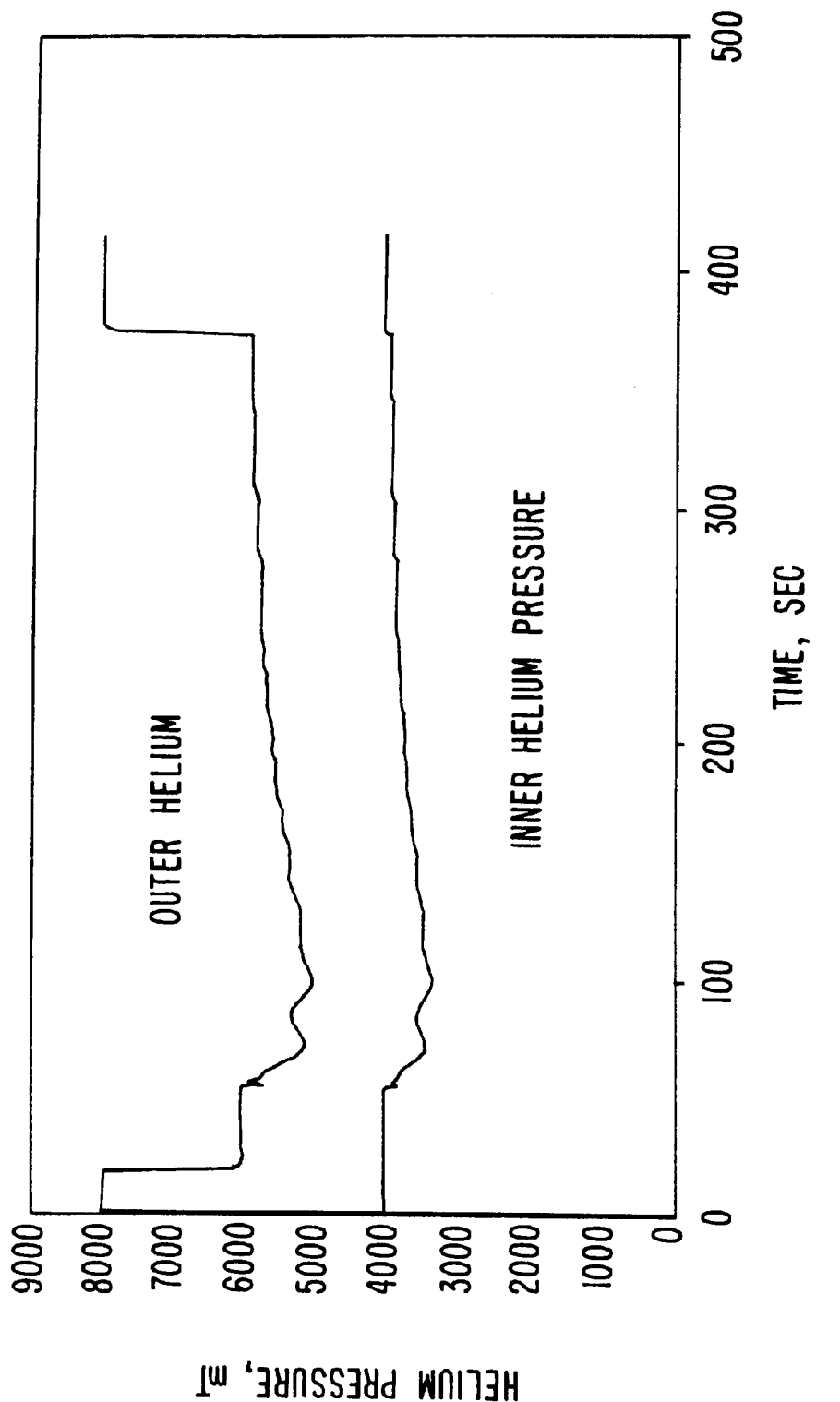
FIG. 7 is a graph of helium pressure for outer and inner helium inlet vs. time for the example.
Figure 8:
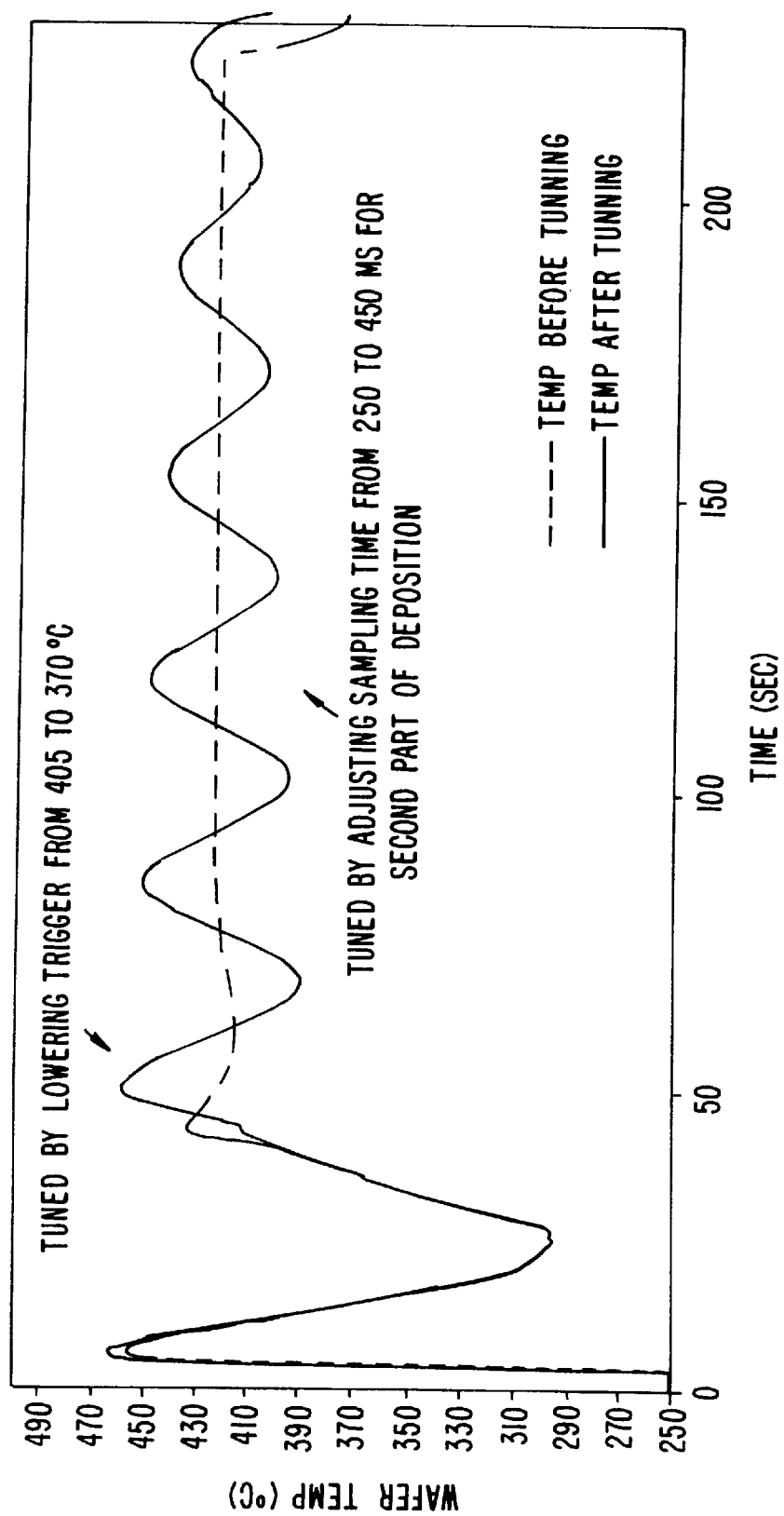
FIG. 8 is a graph of wafer temperature vs. time after changing $T_T$ and $Time_S$ in the example.

The plasma processing apparatus was turned on and top source RF power was 1200 W for heating the wafer. When the temperature of the wafer W reached the value of $T_T$, 405° C., a signal was sent by controller to the helium supply to begin the flow of helium to the wafer via inner and outer initial conditions of 4000 mT inner and 6000 mT outer helium pressure. Subsequently, the controller sent a signal to commence RF bias power to chuck at a power of 2500 W, and additional heating of wafer W commenced. As best shown in FIG. 4, K is determined by the RF bias power to the pedestal. The controller commenced RF bias power to the chuck 14 after about 8 secs. when helium began to flow to the wafer. Subsequently, the controller associated with the CVD apparatus sent a signal to commence the flow of the gases Ar, $O_2$ and $SiH_4$ (silane) and the subsequent deposition of $SiO_2$ on the silicon wafer. After the temperature of the wafer reached 420° C., sampling time, $Time_S$, at 250 ms commenced for the controller/computer to commence determining $P=K(T_W-T_{SP})$ every 250 ms and adjusting the flow of helium accordingly. The result of the wafer temperature control for this example is illustrated on the graph of FIG. 6. The first peak in FIG. 6. Is due to light transmission through the wafer. When the wafer is cold or below 200° C., the plasma light interferes with the wafer temperature measurement. The measurement is correct only above 250° C. FIG. 7 illustrates the change in outer and inner helium pressure through the wafer temperature control process. FIG. 8 is a graph of wafer temperature vs. time after changing the foregoing example such that $T_T$ was 370° C. and increasing the sampling time, $Time_S$, from 250 ms to 450 ms. Increase of $Time_S$ causes increase in temperature variation (i.e., $T_W-T_{SP}$) for the wafer.

Thus, while the present invention has been described herein with reference to particular embodiments thereof, a latitude of modification, various changes and substitutions are intended in the foregoing disclosure, and it will be appreciated that in some instances some features of the invention will be employed without a corresponding use of other features without departing from the scope and spirit of the invention as set forth. Therefore, many modifications may be made to adapt a particular situation or material to the essential scope and spirit of the present invention. It is intended that the invention not be limited to the particular embodiment disclosed as the best mode contemplated for carrying out this invention, but that the invention will include all embodiments and equivalents falling within the scope of the appended claims.

What is claimed is:

1. A process for controlling the temperature of a substrate in a plasma processing reactor chamber comprising flowing a cooling gas to a substrate at a flow pressure and through a substrate support supporting the substrate; determining a temperature of the substrate; determining the difference between the temperature of the substrate and a desired temperature of the substrate; determining a pressure by which the flow pressure of the cooling gas is to be adjusted; and adjusting the flow pressure of the cooling gas to the substrate in accordance with the determined pressure.

2. The process of claim 1 wherein determining the pressure comprises using the formula $P=K(T_W-T_{sp})$, wherein P is the determined pressure, K is a constant, $T_w$ is the temperature of the substrate, and $T_{sp}$ is the desired temperature.

3. The process of claim 2 wherein K is from about 0.5 to about 6.0.

4. The process of claim 2 wherein the cooling gas is a first gas and the flow pressure is a first flow pressure, and wherein the process further comprises: flowing a second gas to the substrate through the substrate support at a second flow pressure.

5. The process of claim 4 further comprising, after adjusting the first flow pressure: adjusting the second flow pressure using a predetermined ratio and the adjusted first flow pressure.

6. The process of claim 4 wherein the first and second gases are respectively directed to inner and outer zones of the substrate support, and wherein the process further comprises: determining if the adjusted first flow pressure is between a minimum and a maximum inner pressure: and determining if the adjusted second flow pressure is between a minimum and a maximum outer pressure.

7. The process of claim 2 wherein the process further comprises: repeating determining the temperature of the substrate, determining the pressure, and adjusting the flow pressure, after a predetermined sampling time has elapsed.

8. The process of claim 2 wherein the gas comprises a noble gas. processing chamber.

9. The process of claim 2 wherein the substrate support is an electrostatic chuck.

10. The process of claim 2 further comprising:
applying an RF bias to the substrate support.

11. A process of controlling the temperature of a substrate disposed on a substrate support in a processing chamber, the process comprising:
   a) flowing a first gas through the substrate support at a first flow pressure;
   b) flowing a second gas through the substrate support at a second flow pressure;
   c) determining a difference between a measured substrate temperature and a desired substrate temperature; and
   d) adjusting the first gas flow pressure and adjusting the second gas flow pressure using the determined difference between the measured substrate temperature and the desired substrate temperature.

12. The process of claim 11 wherein determining the difference between the measured substrate temperature and the desired substrate temperature comprises:
   determining a pressure P using the formula $P=K(T_w-T_{sp})$, wherein K is a constant, $T_w$ is the measured substrate temperature, and $T_{SP}$ is a desired temperature.

13. The process of claim 11 wherein the first gas flows through an inner zone of the substrate support and the second gas flows through an outer zone of the substrate support.

14. The process of claim 11 wherein adjusting the first gas flow pressure and adjusting the second gas flow pressure comprises:
   i) adjusting the first gas flow pressure using the determined difference between the measured substrate temperature and the desired substrate temperature; and then
   ii) adjusting the second gas flow pressure using the adjusted first gas flow pressure and a predetermined ratio.

15. The process of claim 14 wherein i) adjusting the first gas flow pressure using the difference between the substrate temperature and the desired substrate temperature comprises:
   adjusting the first gas flow pressure using a pressure P and the first gas flow pressure, wherein $P=K(T_w-T_{sp})$ where K is a constant, $T_W$ is the measured substrate temperature, and $T_{sp}$ is the desired substrate temperature.

16. The process of claim 11 wherein the substrate support is an electrostatic chuck.

17. The process of claim 11 further comprising: applying an RF bias to the substrate support.

18. The process of claim 2 wherein K is determined by an RF bias level applied to the substrate support.

19. The process of claim 15 wherein K is determined by an RF bias level applied to the substrate support.

* * * * *